(12) United States Patent
Penchuk

(10) Patent No.: US 7,221,580 B1
(45) Date of Patent: May 22, 2007

(54) MEMORY GAIN CELL

(75) Inventor: Robert A. Penchuk, Wrentham, MA (US)

(73) Assignee: Analog Devices, Inc., Norwood, MA (US)

( * ) Notice: Subject to any disclaimer, the term of this patent is extended or adjusted under 35 U.S.C. 154(b) by 104 days.

(21) Appl. No.: 10/648,939

(22) Filed: Aug. 27, 2003

(51) Int. Cl.
*G11C 11/24* (2006.01)

(52) U.S. Cl. ................................ 365/149; 365/187

(58) Field of Classification Search ............... 365/149, 365/187, 63
See application file for complete search history.

(56) References Cited

U.S. PATENT DOCUMENTS

| | | | | |
|---|---|---|---|---|
| 3,882,472 A | * | 5/1975 | Smith | 365/149 |
| 4,935,896 A | * | 6/1990 | Matsumura et al. | 365/187 |
| 5,220,530 A | * | 6/1993 | Itoh | 365/189.01 |
| 5,513,139 A | * | 4/1996 | Butler | 365/189.04 |
| 5,761,114 A | | 6/1998 | Bertin et al. | |
| 5,909,400 A | * | 6/1999 | Bertin et al. | 365/187 |
| 6,016,268 A | * | 1/2000 | Worley | 365/149 |
| 6,246,083 B1 | * | 6/2001 | Noble | 257/296 |
| 6,314,017 B1 | * | 11/2001 | Emori et al. | 365/149 |
| 6,845,059 B1 | * | 1/2005 | Wordeman et al. | 365/230.05 |
| 2002/0093508 A1 | * | 7/2002 | Sandford | 345/571 |

OTHER PUBLICATIONS

PCT/US2004/027818 International Search Report Aug. 26, 2005.

\* cited by examiner

*Primary Examiner*—Vu A. Le
(74) *Attorney, Agent, or Firm*—Wolf, Greenfield & Sacks, P.C.

(57) ABSTRACT

A memory cell includes: a charge storage element (e.g., capacitor); a switch constructed and arranged to selectively connect the charge storage element to a first data line, responsive to a first select signal; and a gain element having an input connected to receive a signal from the capacitor and constructed and arranged to selectively provide a corresponding output signal to a second data line, responsive to a second select signal. The switch can be a FET having a drain connected to the first data line, a source connected to the capacitor and a gate connected to the first select signal. The gain element can be a FET having a gate connected to the capacitor, a source connected to the second data line and a drain selectively connected to one of an upper power supply and a lower power supply. The switch can transfer a signal from the first data line onto the capacitor and can transfer a signal from the capacitor onto the first data line when selected by the first select signal. A two-dimensional array of such memory cells can be formed, wherein the first select signal and the second select signal orthogonally select cells, to facilitate matrix pivot operations and bit interleave/de-interleave operations. Also, a method of addressing an array of such memory cells can comprise: writing groups of bits linearly arrayed with respect to each other; and reading groups of bits linearly arrayed with respect to each other and orthogonally disposed to the groups of bits written.

3 Claims, 3 Drawing Sheets

US 7,221,580 B1

MEMORY GAIN CELL

FIELD OF THE INVENTION

The present invention relates to memory cells. Somewhat more particularly, the invention relates to those memory cells known as gain cells and to memory configurations using gain cells.

BACKGROUND OF INVENTION

Numerous memory cell configurations are known in the art. Each possesses advantages and disadvantages, some advantages and disadvantages being related to the number of transistors employed. Skilled artisans frequently classify the various configurations into groups according to the number of transistors associated with a single storage element present in a single memory cell. Thus a circuit including a storage element coupled to but a single transistor is referred to as a 1T cell, as illustrated schematically in FIG. 1. The cell has simply a storage element, CS, and a single transistor, Q1, that functions as a transfer gate element. Applying the same taxonomy, a cell including a single storage element coupled to three transistors is referred to as a 3T cell.

Some memory cells are further classified as gain cells. These are memory cells having at least one output transistor (i.e., a gain element) configured to amplify or buffer the signal stored on the storage element, (i.e., buffering it from the output line). This permits the signal stored on the storage element to be read non-destructively, obviating the need for a write or refresh operation after each read cycle. (Note that "gain" does not necessarily require an amplification factor greater than unity.)

Interestingly, there is no conventional 2T gain cell. There is a cell configuration sometimes referred to as a 2T cell, but that configuration is actually a dual 1T cell, rather than a true 2T cell. That is, it is the circuit of FIG. 1 in duplicate, one transistor per storage element.

As noted above, gain cells are advantageous for allowing non-destructive reads. In the continual drive to make memory cells smaller and smaller, many designers strive to use fewer and fewer transistors in each gain cell. Thus, there are gain cell designs with, for example, three and four transistors known. But, as noted above, the two transistor gain cell design commonly referred to as a 2T design is not a true 2T gain cell (which would have one storage element and two transistors) but, rather, is a dual 1T cell. Despite the drive for small size and the advantages of gain cells, there is no 2T gain cell—at least not one in widespread use.

An excellent discussion of gain cells is found in Itoh, K., VLSI Memory Chip Design, Springer Series, 2001. Examples of conventional 3T gain cells described by Itoh are shown schematically in FIGS. 2–5. Each includes three transistors, Q1, Q2 and Q3, the storage element in each of these examples being the gate of Q2. The signal on the gate of Q2 is buffered at least by Q2, itself.

Memory is designed into a wide variety of systems that process a very wide variety of data. Especially in digital signal processing systems, and even more especially in systems that must process data in real time, it is desirable to have memory with plural access ports. Conventionally, adding access ports to a memory increases the complexity of the individual memory cells, for example increasing the number of transistors used in each cell, and consequently increases the power consumption of such memory.

Consequently, a need exists for a 2T gain cell suitable for use as a memory cell, for a 3T gain cell, and for other efficient gain cell designs. A further need exists for such cells which have multiple access ports and which otherwise are well-suited for digital signal processing uses including, without limitation, matrix operations such as pivots, and bit interleaving/de-interleaving.

SUMMARY OF INVENTION

Accordingly, a memory cell, as contemplated herein, includes: a storage element (e.g., a capacitor however formed, including but not limited to a gate capacitance) on which a charge can be stored; a switch constructed and arranged to selectively connect the capacitor to a first data line, responsive to a first select signal; and a gain element having an input connected to receive a signal from the storage element and constructed and arranged to selectively transfer an output signal to a second data line, responsive to a second select signal. The switch can be a transistor such as a field-effect transistor, FET, having a first element (e.g., a drain) connected to the first data line, a second element (e.g., a source) connected to the storage element and a third, control element (e.g., a gate) connected to the first select signal. The gain element can be a transistor such as a FET having a first element (e.g., a gate) connected to the storage element, a second element (e.g., a source) connected to the second data line and a third element (e.g., a drain) selectively connected to one of a first power supply and a second power supply. The switch can transfer a signal from the first data line onto the capacitor and can transfer a signal from the capacitor onto the first data line when selected by the first select signal. The memory cell can be part of a two-dimensional array, wherein the first select signal and the second select signal are disposed orthogonally to each other. Also, a method of addressing an array of memory cells can comprise: writing groups of bits linearly arrayed with respect to each other; and reading groups of bits linearly arrayed with respect to each other and orthogonally to the groups of bits written.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
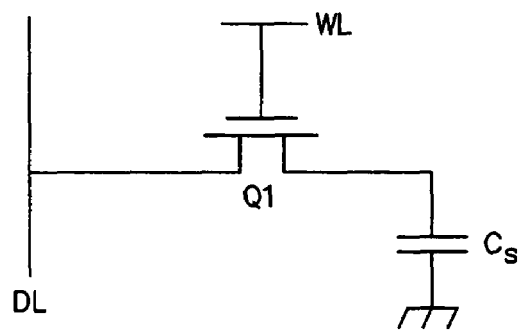
FIG. 1 is a circuit schematic of a basic 1T memory cell.
Figure 2:
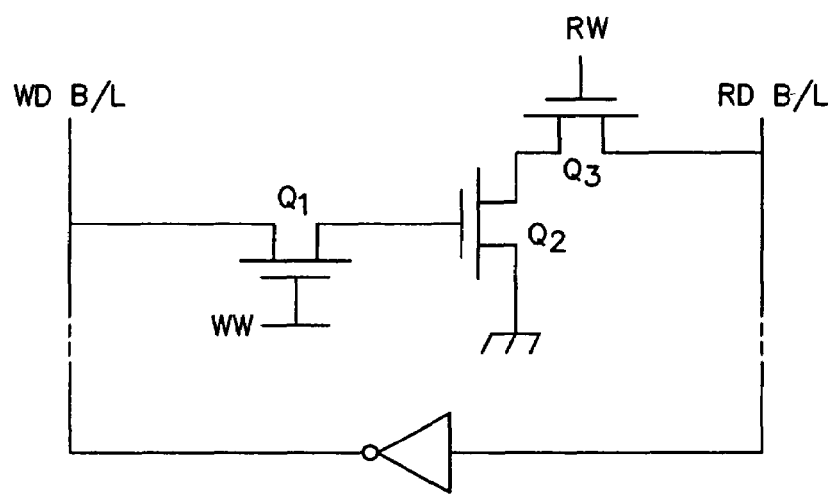
FIG. 2 is a circuit schematic of a first conventional 3T cell.
Figure 3:
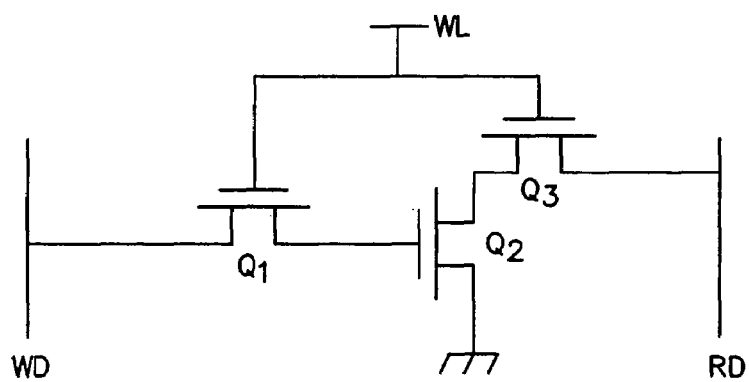
FIG. 3 is a circuit schematic of a second conventional 3T cell.
Figure 4:
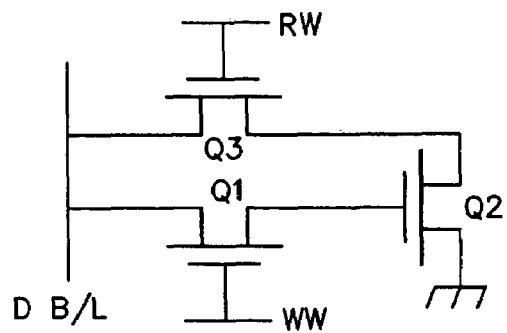
FIG. 4 is a circuit schematic of a third conventional 3T cell.
Figure 5:
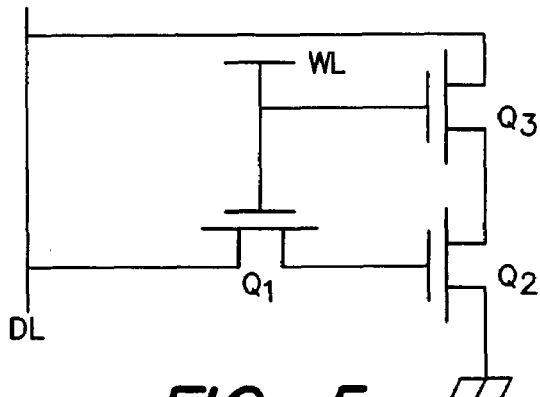
FIG. 5 is a circuit schematic of a fourth conventional 3T cell.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

According to aspects of one embodiment of the invention, a memory cell includes only two transistors. The exemplary cell also is configured so that, when a collection of these cells is arranged in a regular array, the operations of writing data to cells and reading data from cells address the cells along orthogonal directions within the array. This allows a single write operation followed by a single read operation to perform a matrix pivot operation, which is a frequent and time-consuming operation in some common digital signal processing applications. Similarly, alternating read and write operations can perform bit interleaving and de-interleaving.

Figure 6:
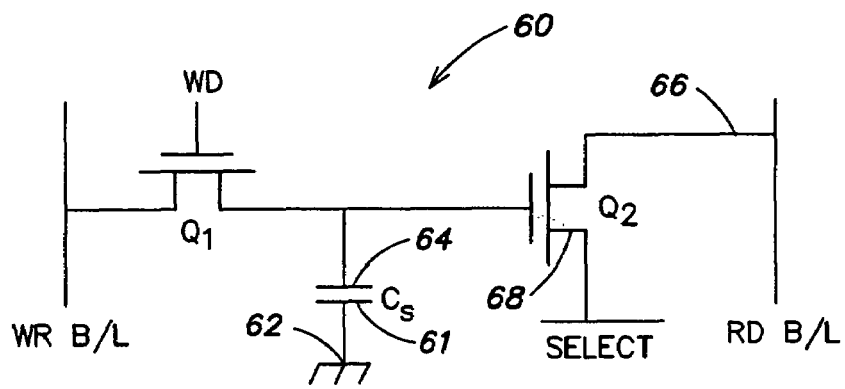
FIG. 6 is a circuit schematic of a 2T cell according to some aspects of embodiments of the invention.

The illustrative memory cell 60 of FIG. 6 is now described in detail.

The storage element of the memory cell 60 of FIG. 6 is capacitor $C_s$. One plate 61 of capacitor $C_s$ is tied to a reference node 62, for example a ground node in the circuit. That ground node might be the substrate of the device in which the memory cell is constructed, as shown. The other plate 64 of capacitor $C_s$ carries a voltage (referenced to node 62) proportional to the charge stored on the capacitor and representing the data value (a 1 or a 0) stored in the memory cell. On the one hand, the voltage-carrying plate 64 of capacitor $C_s$ is connected through transistor $Q_1$ to a write bit line, WR B/L. Transistor $Q_1$ is controlled by applying a signal through a word line, WD, to the gate of transistor $Q_1$. On the other hand, the voltage-carrying plate of capacitor $C_s$ is connected to control the gate of transistor $Q_2$. Transistor $Q_2$ may be symmetric with respect to its drain and source terminals. One of the drain and source (labeled element 66) is connected to a read bit-line, RD B/L. The other of the drain and source (labeled element 68) is connected to a switched select line, which may carry one of either $V_{ss}$ or $V_{dd}$ (i.e., a logic low or a logic high signal, respectively). The word line, WD, and bit lines WR B/L and RD B/L may be laid out (i.e., disposed) orthogonally relative to each other.

To write a bit to the cell, data is applied to the write bit line, WR B/L, and the word line WD is strobed to allow switch $Q_1$ (acting as a transfer gate) to transfer the data to the storage device, $C_s$, while the select line is held at $V_{dd}$. Data can be read back by simply lowering the select line to $V_{ss}$ and sensing the output on the read bit line RD B/L. Alternatively, the cell can be read through the write bit line WR B/L by connecting the write bit line to a sense amplifier and strobing the word line WD. The orthogonal arrangement of the word line, WD, used for writing and the select line, SELECT, used for reading on the read bit line, RD B/L, allows selection of different groups of cells for writing and for reading. This characteristic inherently permits execution of a matrix pivot and bit interleaving/de-interleaving operations without requiring any external processing of the data.

Figure 7:
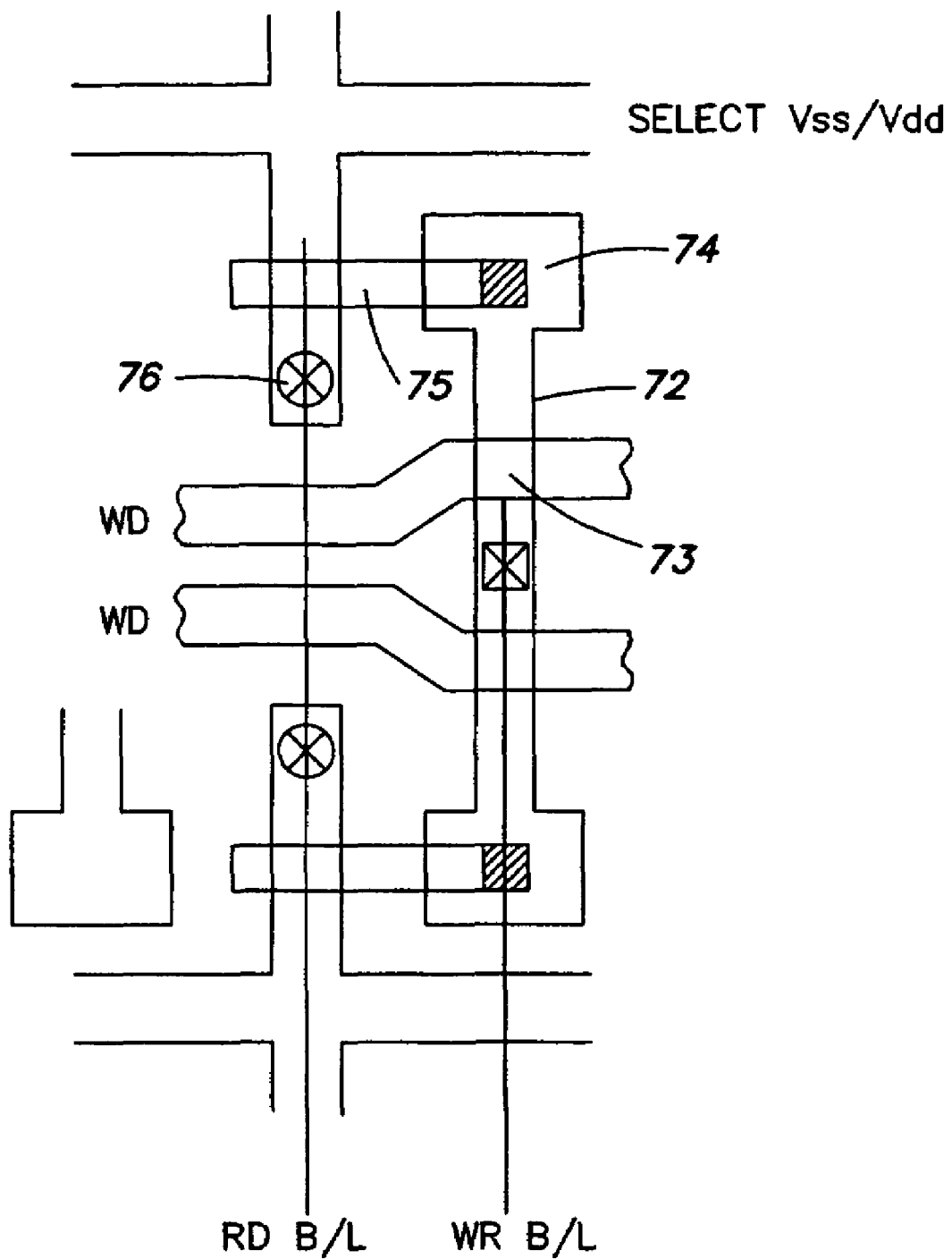
FIG. 7 is a layout floor plan of the 2T cell of FIG. 6.

One possible layout for a memory cell 60 having the schematic of FIG. 6 is shown in FIG. 7. As can be seen, the cell is very compact. Word lines, WD, run in one direction, horizontally across the cell, as shown. Bit lines, WR B/L and RD B/L run orthogonally to the word lines, WD, vertically across the cell, as shown. A diffusion path 72 from a connection to the write bit line, WR B/L, to the gate of $Q_2$ is crossed by the word line, WD, at 73 to form the gate of $Q_1$. The voltage-carrying plate of storage device $C_s$ is formed primarily by a storage area attached to expanded area 74 of the diffusion path just described, which overlies the substrate forming the plate connected to the reference node. A polysilicon gate 75 extends from the voltage-carrying plate of $C_s$ to a point over the channel defining transistor Q2, which runs between a connection 76 to the read bit line, RD B/L, and the select line identified as $V_{ss}/V_{dd}$.

The circuit shown in FIGS. 6 and 7 is advantageous for several reasons. The topology shown allows the gate of $Q_2$ to be connected to the storage capacitor $C_s$ without requiring an additional contact between layers of the circuit. That is, the same metal that forms the gate of $Q_2$ also forms the storage plate of capacitor $C_s$. Another advantage is that the bit and word lines of this cell are interchangeable and disposed orthogonally. A plurality of such cells can be arranged to form a two-dimensional array. Such an array of cells can be written along one dimension and read back from the orthogonal direction. Thus, an array of such cells can perform matrix pivoting in a single hardware cycle by rotating a matrix about its diagonal as read and write operations are performed orthogonally within the matrix. When matrix pivoting operations are not desired, then the write bit line, WR B/L can carry either write data or read data, as desired.

Such an array also lends itself to bit interleaving/de-interleaving.

A sensing scheme is preferred with clamps the RD B/L to a voltage no less than the threshold of Q2 (68) below $V_{dd}$. This prevents reverse conduction through Q2. For instance, if Cs is charge to $V_{dd}$, with the select line "off" (also at $V_{dd}$), if the RD B/L is discharged to less than $V_{dd}$–Vtn (Vtn is the threshold of Q2) due to selection of another memory cell on the same RD B/L, then $Q_2$ will turn on and clamp the RD B/L.

The inventive concepts discussed herein are not limited in utility to any single family of memory circuits but are useful in various memory technologies, including, but not limited to, SRAM, MRAM and FRAM.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A memory cell, consisting essentially of:
    a charge storage element;
    a one-transistor switch constructed and arranged to selectively connect the storage element to a first data line, responsive to a first select signal; and
    a one-transistor gain element having an input connected to receive a signal from the storage element and constructed and arranged to selectively provide a corresponding output signal to a second data line, responsive to a second select signal, the gain element comprising a FET having a first terminal connected to the storage element, a second terminal connected to the second data line and a third terminal selectively connected to one of a first power supply and a second power supply, the FET being symmetrical with respect to the second and third terminals.

2. The memory cell of claim 1, wherein the FET is symmetrical with respect to the second and third terminals.

3. The memory cell of claim 2, wherein the first terminal is a gate, the second terminal is a source and the third terminal is a drain.

* * * * *